United States Patent [19]
Hoover

[11] 4,333,057
[45] Jun. 1, 1982

[54] DIFFERENTIAL-INPUT COMPLEMENTARY FIELD-EFFECT TRANSISTOR AMPLIFIER

[75] Inventor: Merle V. Hoover, Flemington, N.J.

[73] Assignee: RCA Corporation, New York, N.Y.

[21] Appl. No.: 133,254

[22] Filed: Mar. 24, 1980

[51] Int. Cl.³ ............................................. H03F 3/45
[52] U.S. Cl. .................................... 330/253; 330/264
[58] Field of Search ...................... 330/253, 264, 295

[56] References Cited

U.S. PATENT DOCUMENTS

| | | |
|---|---|---|
| 3,870,966 | 3/1975 | Dingwall . |
| 3,946,327 | 3/1976 | Hsu . |
| 3,991,380 | 11/1976 | Pryor .................................. 330/264 |
| 3,997,849 | 12/1976 | Thommen . |
| 4,069,431 | 1/1978 | Kucharewski ...................... 330/253 |
| 4,184,124 | 1/1980 | Asakawa . |

OTHER PUBLICATIONS

Data Sheet, "CA 3600E, COS/MOS Transistor Array", RCA Linear Integrated Circuits Data Book, SSD-240A, 1978, pp. 282-286.

Primary Examiner—Michael J. Tokar
Attorney, Agent, or Firm—E. M. Whitacre; P. J. Rasmussen; C. A. Berard, Jr.

[57] ABSTRACT

A complementary field-effect transistor amplifier includes first, second, and third FET inverter amplifiers. Input signals are applied to input connections of the first and third inverter amplifiers and the output connections thereof respectively connect to first and second nodes. The first node connects to the input connection of the second inverter amplifier, the output connection of which amplifier connects to the second node where the input signals are combined. A fourth inverter amplifier includes a degenerative feedback connection and has its output connected for providing a load at the first node. Signals responsive to the combination of the first and second input signals can be further amplified by a fifth inverter amplifier and supplied therefrom to an output terminal.

24 Claims, 3 Drawing Figures

DIFFERENTIAL-INPUT COMPLEMENTARY FIELD-EFFECT TRANSISTOR AMPLIFIER

This invention relates generally to transistor amplifiers employing complementary field-effect transistors (FETs) and, in particular, to such amplifiers wherein the output signal is responsive to the difference between two input signals.

Known amplifiers employ complementary FETs in inverter amplifier configuration wherein the drain-source conduction paths of a P-channel and an N-channel transistor are serially connected with the source of the N-channel FET receiving a relatively negative operating potential and the source of the P-channel FET receiving a relatively positive operating potential. The gates thereof interconnect to serve as an input connection and the drains thereof interconnect to serve as an output connection from which signals responsive to the signals applied at the input connection and inverted therefrom may be obtained.

One such amplifier is shown in the U.S. Pat. No. 3,946,327 issued Mar. 23, 1976 to S. T. Hsu wherein two such complementary field-effect FET inverter amplifiers are connected in cascade. There, the input and output connections of the second inverter amplifier connect together making the effective amplifier gain determined by the transconductance ratio between the transistors in the first and second inverter amplifiers.

Because it is difficult to differentially combine signals in complementary FET amplifiers, such amplifiers commonly have a single input and a single output.

The present invention overcomes such difficulty by employing first, second and third FET inverter amplifier means. Respective input signals are applied to the input connections of the first and third inverter amplifiers, and the output connection of the third inverter amplifier is connected to the input connection of the second inverter amplifier. Means for combining signals includes connections of the respective output connections of the first and second inverter amplifiers to a second node, which node is connected by output means to an output terminal.

Figure 1:
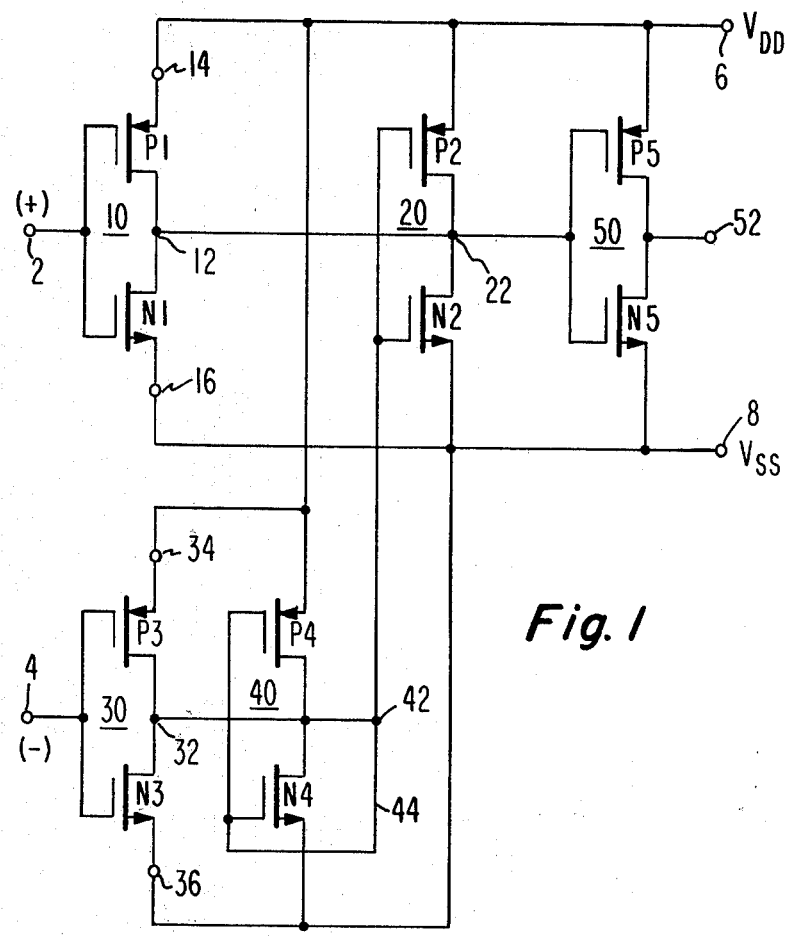
FIG. 1 is a schematic diagram of an amplifier embodying the invention.

The amplifier circuit of FIG. 1 includes complementary FET inverter amplifiers 10, 20, 30, 40, and 50, each including a respective one of P-channel FETs P1–P5 having its source receiving relatively positive operating potential $V_{DD}$ at supply terminal 6 and each including a respective one of N-channel FETs (N1–N5) having its source receiving relatively negative operating potential $V_{SS}$ at supply terminal 8. The gates of the respective P- and N-channel FETs connect in common to serve as an input connection of each inverter amplifier while the drains thereof connect in common to serve as an output connection thereof.

Operation of each such inverter amplifier is similar to that of inverter 10, now to be described. P-channel FET P1 and N-channel FET N1 each serve as variable transconductance means respectively interconnecting supply connection 14 with output connection 12 and output connection 12 with supply connection 16. When the signal applied at input terminal 2 tends to move toward supply potential $V_{DD}$, the transistor action of P1 decreases the conductance (of its drain-source conduction path) between connections 14 and 12 and FET N1 increases the conductance between connections 12 and 16. On the other hand, when the signal at input terminal 2 tends towards the potential $V_{SS}$, the conductance of P1 increases and that of N1 decreases. So, signals at output connection 12 are inverted from and responsive to the input signal at terminal 2; the magnitude of amplification provided by inverter amplifier 10 being determined by the transconductances of P1 and N1 and the effective load conductance, if any, at connection 12.

Operation of the amplifier circuit of FIG. 1 is as follows:

Signals responsive to input signals received at input terminals 2 and 4 are applied to nodes 22 and 42 respectively by inverter amplifiers 10 and 30 via their respective output connections 12 and 32. Inverter amplifier 20 receives signals from node 42 at its input connection and supplies signals inversely responsive to them to node 22 for additive combination with signals from the output connection of inverter 10. Thus inverter amplifiers 10, 20 and 30 form the nucleus of the FIG. 1 amplifier receiving two input signals at terminals 2 and 4, respectively, and making available a combined output signal at node 22 which output signal is differentially responsive to the input signal.

It is usually desirable to load the interconnection between output connection 32 of inverter 30 and the input connection to inverter amplifier 20 so as to obtain amplifier gain characteristics between terminal 2 and node 22 on one hand, and between terminal 4 and node 22 on the other hand, which are in predetermined ratio—e.g., minus unity. This load means is conveniently obtained, for example, by inverter amplifier 40 with output connection to node 42. Degenerative feedback connection 44 from node 42 to the input connection of inverter 40 establishes a conductance characteristic at node 42 which may be made substantially equivalent to the transconductance characteristics of at least one of amplifiers 20 or 30.

In one embodiment, the gain between input terminal 4 and node 42 is made equal to minus unity by control of the width-to-length ratios of the channel areas of FETs P3, P4, N3, and N4 as taught by Hsu, supra. The ratio of responses to signals applied to input terminals 2 and 4 is then determined by simply scaling the relative channel conductances of the FETs in inverter amplifiers 10 and 20. If the gains of inverter amplifiers 10 and 20 are made equal, the potential at node 22 is responsive to the difference between the input signals applied at terminals 2 and 4, and response to the common-mode component of those signals is suppressed. Supply voltage rejection is also good for the configuration thus far described because the equivalent characteristics of the FETs produce equivalent responses to such disturbances.

Alternatively, the FETs of amplifiers 20 and 40 may be scaled to have equal transconductances so that the loading they exhibit at nodes 22 and 42 are equal. If the gains of inverter amplifiers 10 and 30 are made equal, the desirable minus unity of gains from terminals 2 and 4 to node 22 is achieved. The potential at node 22 is then responsive to the difference between the signals at terminals 2 and 4 and advantages of good supply voltage rejection and suppression of common-mode response accrue.

Suppression of the common-mode signal and rejection of supply voltage changes is aided by the loading of inverter amplifier 10 by the FETs in amplifier 20 being substantially the same as that provided to amplifier 20 by the FETs of amplifier 10. Similar interaction occurs inbetween amplifiers 30 and 40. In a preferred embodiment, the FETs of amplifiers 10, 20, 30 and 40 are made to exhibit substantially equal transconductance characteristics.

Combined signals at node 22, responsive to the input signals at terminals 2 and 4, are further amplified by inverter amplifier 50 which receives combined signals at its input connection and supplies amplified and inverted signals responsive thereto to output terminal 52.

Because the input circuit of inverter amplifier 50 in comparison to the output circuits of inverter amplifiers 10 and 20 is an extremely high impedance load to node 22, the transconductance characteristics of P5 and N5 can be selected for maximum advantage based upon the loads contemplated for connection to output terminal 52. FETs P5 and N5 have channel lengths selected to supply the desired output current and have channel width-to-length ratios selected to provide the desired gain.

The operational amplifier of FIG. 1 is employable in feedback amplifiers including a direct-coupled feedback connection between output terminal 52 and inverting sense input terminal 4, such as through a resistor (not shown). FET inverter amplifiers naturally tend towards quiescent equilibrium where the potentials at its input and output connections are midway between supply potentials $V_{DD}$ and $V_{SS}$ thereby minimizing the voltage translation necessary to establish equilibrium when they are employed in such feedback amplifiers. Because no series elements other than the complementary FETs are necessary, the full supply voltage range between $V_{DD}$ and $V_{SS}$ is available for signal swing within and at the output of the amplifier of FIG. 1.

Simplicity and symmetry of structure, and absence of resistors render the operational amplifier of FIG. 1 suitable for construction in known integrated circuit technologies where resistors are difficult to produce or have numerous technical shortcomings (for example, in silicon-on-sapphire (SOS) technology). In any event, integrated circuit amplifiers according to the present invention require no additional chip area for resistive elements; circuit performance is not adversely affected by variations of such resistive elements.

Figure 2:
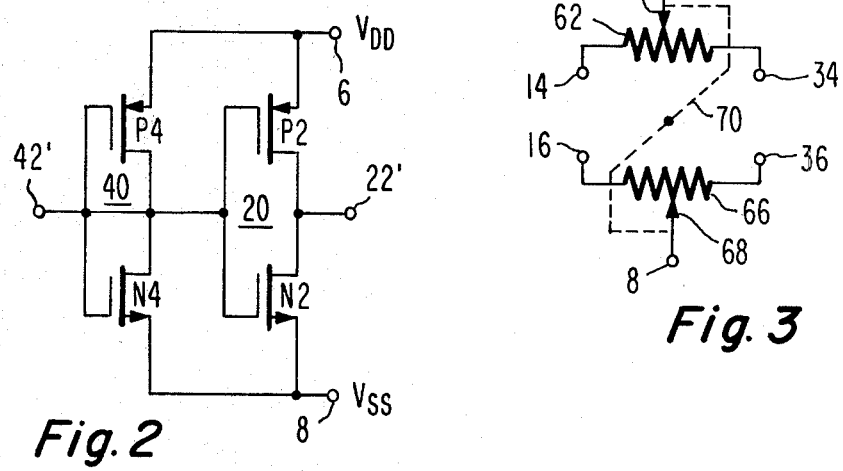
FIG. 2 is a schematic diagram of a subcircuit of FIG. 1.

One may consider the inverter amplifiers 40 and 20 alone as a bidirectional current mirror amplifier (CMA) as shown in FIG. 2. If current is applied to its input connection 42' (i.e. so that the drain-source current of N4 exceeds that of P4), then its output terminal is a current sink withdrawing current into node 22' (i.e. the drain-source current of N2 exceeds that of P2). Conversely, if current is withdrawn from input connection 42' then current will be sourced (supplied) from node 22'.

It is understood that the symbol used herein for FETs is generic and may represent either junction-type or insulated-gate type FETs. While either depletion-mode or enhancement-mode FETs may be employed, insulated-gate enhancement-mode FETs are preferred.

Figure 3:
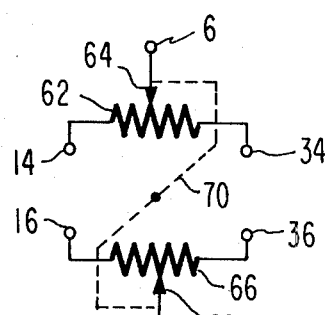
FIG. 3 is a schematic diagram of a modification of the embodiment of FIG. 1.

Input offset voltage difference between input terminals 2 and 4 is nulled by varying the operating potentials applied to supply connections 14, 16, 34, 36 of inverter amplifiers 10 and 30. In FIG. 3, variable resistor 62 connects between respective supply connections 14 and 34 of amplifiers 10 and 30, and wiper arm 64 connects to supply voltage $V_{DD}$ at terminal 6. Quiescent currents drawn by amplifiers 10 and 30 through connections 14 and 34 respectively cause potential drops in resistance 62. Movement of arm 64 towards connection 14 increases the relatively positive operating potential applied to amplifier 10 and decreases that applied to amplifier 30.

Similarly, the respective ends of variable resistor 66 connect to connections 16 and 36 of amplifiers 10 and 30, respectively, and wiper arm 68 connects to relatively negative potential $V_{SS}$ at supply terminal 8. Movement of wiper arm 68 similarly varies the negative operating potential applied at connections 16 and 36. While only one of variable resistors 62 and 66 may be required in any particular application of the amplifier of FIG. 1, it is advantageous to employ both variable resistors 62 and 66, and to operate them cooperatively (shown symbolically by dashed line 70 indicating a predetermined relationship between the positions of respective wiper arms 64 and 68). Cooperative movement of arm 64 towards connection 34 and of arm 68 towards terminal 16 causes the operating potentials applied at connections 14 and 16 of amplifier 10 to move towards $V_{SS}$ while the operating potentials at connections 34 and 36 of amplifier 30 move toward $V_{DD}$. Cooperative movement of arms 64 and 68 in the opposite direction causes respectively opposite movement of those operating potentials. The potential differences between supply connections 14-16 and 34-36, however, tend to remain substantially unchanged.

While the description and figures herein describe preferred alternative embodiments incorporating the present invention, one skilled in the art of design when armed with the teachings of this disclosure would be able to envision further embodiments without departing from the scope and spirit of the invention. For example, in any of inverter amplifiers 10, 20, 30, 40, 50 a further P-channel FET could be connected in cascode connection with the P-channel FET shown in FIG. 1 and a further N-channel FET could be connected in cascode connection with the N-channel FET shown in FIG. 1. Furthermore, in establishing advantageous relationships between the respective channel width-to-length ratios of the various FETs, integral multiples of such ratios may be obtained by the parallel connection of a plurality of transistors having equal ratios.

What is claimed is:

1. An FET amplifying circuit comprising:

first and second input terminals for receiving input signals thereat, and an output terminal;

first and second supply terminals for receiving operating potential therebetween;

first, second and third FET inverter amplifier means, each having an input and an output connection and exhibiting transconductance therebetween, and having respective first and second supply connections connected to said first and second supply terminals, respectively;

respective means for connecting said first and second input terminals to the input connections of said first and third inverter amplifier means, respectively;

interconnection means including a first node, means for connecting the output connection of said third inverter amplifier means to said first node, means for connecting said first node to the input connection of said second inverter amplifier means, fourth FET inverter amplifier means having an input connection, and having an output connection connected to said first node and having first and second supply connections connected to said first and second supply terminals, respectively, and
means for completing a degenerative feedback connection between the output and input connections of said fourth inverter amplifier means;
means for combining signals including
a second node,
means for connecting the output connection of said first inverter amplifier means to said second node, and
means for connecting the output connection of said second inverter amplifier means to said second node; and
output means connecting said second node to said output terminal.

2. The circuit of claim 1 wherein each of said first, second, and third inverter amplifier means exhibits voltage gain and wherein said interconnection means includes means for reducing the voltage gain of said third inverter amplifier means to cause equal and opposite responsivity of a signal at said output terminal to the input signals at said first and second input terminals, respectively.

3. The circuit of claim 1 wherein said first and second inverter amplifier means exhibit substantially similar transconductance characteristics and wherein said third and fourth inverter amplifier means together exhibit substantially minus unity voltage gain.

4. The circuit of claim 1 wherein said second and fourth inverter amplifier means exhibit substantially similar transconductance characteristics and wherein said first and third inverter amplifier means exhibit substantially equal voltage gains.

5. The circuit of claim 1 wherein said output means includes fifth FET inverter amplifier means having an input connection to which said second node connects, having an output connection connected to said output terminal, and having first and second supply connections respectively connected to said first and second supply terminals.

6. The circuit of claim 1 further comprising:
means interposed between said first supply terminal and the respective first supply connections of said first and third inverter amplifier means for varying the operating potentials applied thereto.

7. The circuit of claim 6 wherein said means for varying includes variable resistance means having respective first and second ends connected to the first supply connections of said first and third inverter amplifier means, respectively, and having a wiper arm connected to said first supply terminal.

8. The circuit of claim 6 further comprising:
further means interposed between said second supply terminal and the respective second supply connections of said first and third inverter amplifying means for varying the operating potentials applied thereto.

9. The circuit of claim 8 wherein said further means for varying includes variable resistance means having respective first and second ends connected to the second supply connections of said third and first inverter amplifier means, respectively, and having a wiper arm connected to said second supply terminal.

10. The circuit of claim 8 wherein said means for varying and said further means for varying operate cooperatively so that the potentials at the first and second supply connections of said first inverter amplifier means in a first direction sense when the potentials at the first and second supply connections of said third inverter amplifier means vary in a second and opposite direction sense.

11. The circuit of claims 1 or 5 wherein each said inverter amplifier means comprises:
respective first variable transconductance means for tending to decrease the conductance between the first supply and output connections thereof when the potential at the input connection thereof tends to move towards the potential at said first supply terminal, and
respective second variable transconductance means for tending to decrease the conductance between the output and second supply connections thereof when the potential at the input connection tends to move towards the potential at said second supply terminal.

12. The circuit of claim 11 wherein:
each said first variable transconductance means includes a first field-effect transistor of first conductivity type, having respective source and drain electrodes connected to the first supply and output connections, respectively, of said inverter amplifier means, and having a gate electrode connected to the input connection thereof; and
each said second variable transconductance means includes a second field-effect transistor of complementary conductivity type, having respective drain and source electrodes connected to the output and second supply connections, respectively, of said inverter amplifier means, and having a gate electrode connected to the input connection thereof.

13. The circuit of claim 11 wherein said first and second variable transconductance means exhibit substantially similar transconductance characteristics.

14. A field-effect transistor circuit for combining signals comprising:
first and second input connections to which first and second signals are applied, respectively;
an output connection for supplying the combined signal therefrom;
first and second field-effect transistors of N-channel and P-channel type, respectively, having respective source electrodes connected for receiving relatively negative and relatively positive potentials, respectively, and having respective gate and drain electrodes, and exhibiting respective transconductances therebetween;
third and fourth field-effect transistors of N-channel and P-channel type, respectively, having respective source electrodes connected for receiving relatively negative and relatively positive potentials, respectively, and having respective gate and drain electrodes, and exhibiting respective transconductances therebetween;
means for connecting said first and second transistors in inverting amplifier connection including
respective means for connecting the gate electrodes of said first and second transistors, to a first node, and
respective means for connecting the drain electrodes of said first and second transistors to a second node;
means for connecting said third and fourth transistors in circuit including respective means for connecting the gate electrodes of said third and fourth transistors to said first node, and respective means for connecting the drain electrodes of said third and fourth transistors to said first node;

means for applying current signals responsive to the signals at said first input connection to said first node;

means for applying current signals responsive to the signals at said second input connection to said second node; and means connected to said second node for coupling signals responsive to the current signals thereat to said output connection.

15. The circuit of claim 14 wherein said first through fourth transistors exhibit transconductance characteristics for making the signal at said output connection proportionately responsive to the difference between said first and second signals.

16. The circuit of claim 14 wherein
said means for applying current signals responsive to the signals at said first input connection includes first voltage-to-current converting means connected between said first input connection and said first node for supplying said current signals to said first node; and wherein
said means for applying current signals responsive to the signals at said second input connection includes second voltage-to-current converting means connected between said second input connection and said second node for supplying current signals to said second node.

17. The circuit of claim 16 wherein each of said first and second voltage-to-current converting means includes:
respective fifth and sixth field-effect transistors of N-channel and P-channel type, respectively, having respective source electrodes connected for receiving relatively negative and relatively positive potentials, respectively, and having respective gate and drain electrodes, and exhibiting respective transconductances therebetween;
means for connecting the respective gate electrodes of said fifth and sixth transistors in common and to a respective one of said first and second input connections; and
means for connecting the respective drain electrodes of said fifth and sixth transistors in common and to a respective one of said first and second nodes.

18. The circuit of claim 17 wherein said first and second transistors and the fifth and sixth transistors of said second voltage-to-current converting means exhibit substantially similar transconductance characteristics, and wherein said third and fourth transistors and the fifth and sixth transistors of said first voltage-to-current converting means exhibit transconductance characteristics for providing substantially negative unity voltage gain between said first input connection and said first node.

19. The circuit of claim 18 wherein said first through fourth transistors and the respective fifth and sixth transistors of said first and second voltage-to-current converting means exhibit substantially similar transconductance characteristics.

20. The circuit of claim 14 wherein said means for coupling signals to said output connection comprises:
fifth and sixth field-effect transistors of N-channel and P-channel type, respectively, having respective source and drain and gate electrodes, the respective source electrodes of said fifth and sixth transistors receiving relatively negative and relatively positive potentials, respectively;
means for respectively connecting the gate electrodes of said fifth and sixth transistors to said second node;
and means for respectively connecting the drain electrodes of said fifth and sixth transistors to said output connection.

21. A field-effect transistor (FET) circuit for combining first and second signals comprising:
first and second complementary FET inverter amplifier means, having respective input and output connections and exhibiting transconductance therebetween;
means for connecting the output connection of said first inverter amplifier means to the input connection of said second inverter amplifier means;
a direct coupled feedback connection between the output and input connections of said first inverter amplifier means;
means for connecting the output connection of said second inverter amplifier means to a node;
means for applying the first signal to the input connection of said first inverter amplifier means;
means for applying the second signal to said node; and
means connected to said node for withdrawing an output signal therefrom.

22. The circuit of claim 21 wherein the respective transconductances of said first and second inverter amplifier means are predetermined for making said output signal responsive to the difference between said first and second signals.

23. The circuit of claim 21 further including:
third complementary FET inverter amplifier means included within said means for applying the first signal, having an output connection for supplying the first signal and an input connection for receiving signals to which said first signal is responsive; and
fourth complementary FET inverter amplifier means including within said means for applying the second signal, having an output connection for supplying the second signal and an input connection for receiving signals to which said second signal is responsive.

24. The circuit of claim 21 or 23 wherein said means for withdrawing an output signal includes fifth complementary FET inverter amplifier means having an input connection to which said node connects, and having an output connection for supplying signals responsive to said output signal.

* * * * *